(12) United States Patent
Honma et al.

(10) Patent No.: US 7,554,849 B2
(45) Date of Patent: Jun. 30, 2009

(54) NONVOLATILE SEMICONDUCTOR MEMORY

(75) Inventors: Mitsuaki Honma, Yokohama (JP);
Katsuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 11/940,736

(22) Filed: Nov. 15, 2007

(65) Prior Publication Data
US 2008/0117687 A1 May 22, 2008

(30) Foreign Application Priority Data
Nov. 17, 2006 (JP) .............................. 2006-311778

(51) Int. Cl.
*G11C 16/06* (2006.01)
(52) U.S. Cl. .............................. 365/185.21; 365/185.2; 365/201; 365/189.09
(58) Field of Classification Search ............. 365/185.2, 365/185.21, 201, 189.09
See application file for complete search history.

(56) References Cited

U.S. PATENT DOCUMENTS 5,995,429 A * 11/1999 Kojima et al. ............... 365/201
6,370,075 B1 * 4/2002 Haeberli et al. ............. 365/226
6,944,092 B2 * 9/2005 Kang ..................... 365/233.13
7,277,325 B2 * 10/2007 Fukuda et al. ......... 365/185.22

FOREIGN PATENT DOCUMENTS

JP      2001-255948      9/2001

* cited by examiner

*Primary Examiner*—Viet Q Nguyen
(74) *Attorney, Agent, or Firm*—Oblon, Spivak, McClelland, Maier & Neustadt, P.C.

(57) ABSTRACT

A nonvolatile semiconductor memory for setting control voltages to be supplied to an internal circuit, to an external reference voltage inputted from outside, has a parameter control circuit. The parameter control circuit causes a parameter register to sequentially output the plurality of parameters to a voltage generating control circuit. The parameter control circuit counts, for a fixed period of time, the number of oscillations of each of the trimming flag signals sequentially outputted from the voltage generating control circuit in response to the parameters. The parameter control circuit stores counted values corresponding to the parameters. The parameter control circuit selects the parameter having a maximum counted value as a parameter corresponding to the control voltage closest to the external reference voltage.

12 Claims, 7 Drawing Sheets

| PARAMETER | CONTROL VOLTAGE | COUNTER VALUE IN ABSENCE OF NOISE | COUNTER VALUE A IN PRESENCE OF NOISE | COUNTER VALUE B IN PRESENCE OF NOISE | COUNTER VALUE C IN PRESENCE OF NOISE |
|---|---|---|---|---|---|
| P1 | V1 | 0 | 0 | 0 | 0 |
| P2 | V2 | 0 | 2 | 1 | 0 |
| P3 | V3 | 0 | 4 | 2 | 0 |
| P4 | V4 | 1 | 10 | 10 | 10 |
| P5 | V5 | 0 | 4 | 1 | 4 |
| P6 | V6 | 0 | 2 | 1 | 2 |
| P7 | V7 | 0 | 1 | 1 | 1 |

↑ TERGET

NONVOLATILE SEMICONDUCTOR
MEMORY

CROSS-REFERENCE TO RELATED
APPLICATION

This application is based upon and claims the benefit of priority from the prior Japanese Patent Application No.2006-311778, filed on Nov. 17, 2006, the entire contents of which are incorporated herein by reference.

BACKGROUND OF THE INVENTION

1. Field of the Invention

The present invention relates to nonvolatile semiconductor memories for trimming voltages by a built-in self-test (BIST).

2. Background Art

In nonvolatile semiconductor memories, control voltages including a reference voltage, a reading voltage, and a writing voltage vary greatly among chips. It is therefore necessary to adjust these voltages to a target voltage before shipment.

Conventionally, in order to shorten a time of adjustment and so on, test circuits are included in chips. A tester inputs commands to the test circuits, so that such a kind of test can be automatically conducted by a nonvolatile semiconductor memory.

In some conventional methods of adjusting a reference voltage, a target voltage is inputted to the test circuits from the outside and the target voltage is compared with a voltage corresponding to an internal parameter (for example, see Japanese Patent Laid-Open Publication No. 2001-255948).

In the prior art, in the case of successful adjustment, the test circuit sets a completed flag (outputs a trimming flag signal) to terminate the adjustment.

On the other hand, in the case of unsuccessful adjustment, the test circuit increases (or reduces) the voltage corresponding to the parameter, so that the reference voltage and so on is adjusted to a value close to the external target voltage.

In the prior art, there is a problem that when the trimming flag signal has noise at the examination of the adjustment, control voltages are shifted away from the target voltage and thus desired control voltages cannot be obtained.

SUMMARY OF THE INVENTION

According to one aspect of the present invention, there is provided: a nonvolatile semiconductor memory for setting control voltages to be supplied to an internal circuit, to an external reference voltage inputted from outside, comprising:

a memory cell array connected to word lines along selected rows and bit lines along selected columns and having a plurality of memory cells capable of storing bit information, the memory cells being arranged in a matrix;

a row decoder connected to the word lines and supplying a voltage to the word lines to operate the memory cells;

a sense amplifier connected to the bit lines, reading data stored in the memory cells, and holding the read data and data written in the memory cells;

a parameter register for storing a plurality of parameters corresponding to the plurality of control voltages;

a voltage generating control circuit for generating the control voltages in response to the parameters inputted from the parameter register, comparing the control voltages and the external reference voltage, and outputting trimming flag signals according to comparison results; and a parameter control circuit for controlling the parameter register in response to the trimming flag signals to output the selected parameters to the voltage generating control circuit;

wherein the parameter control circuit causes the parameter register to sequentially output the plurality of parameters to the voltage generating control circuit, counts, for a fixed period of time, the number of oscillations of each of the trimming flag signals sequentially outputted from the voltage generating control circuit in response to the parameters, stores counted values corresponding to the parameters, and selects the parameter having a maximum counted value as a parameter corresponding to the control voltage closest to the external reference voltage.

DETAILED DESCRIPTION

Exemplary embodiments of the present invention will now be described in accordance with the accompanying drawings. In the following explanation, the present embodiment is applied to a NAND flash memory but is also similarly applicable to a nonvolatile semiconductor memory such as a NOR flash memory.

First Embodiment

Figure 1:
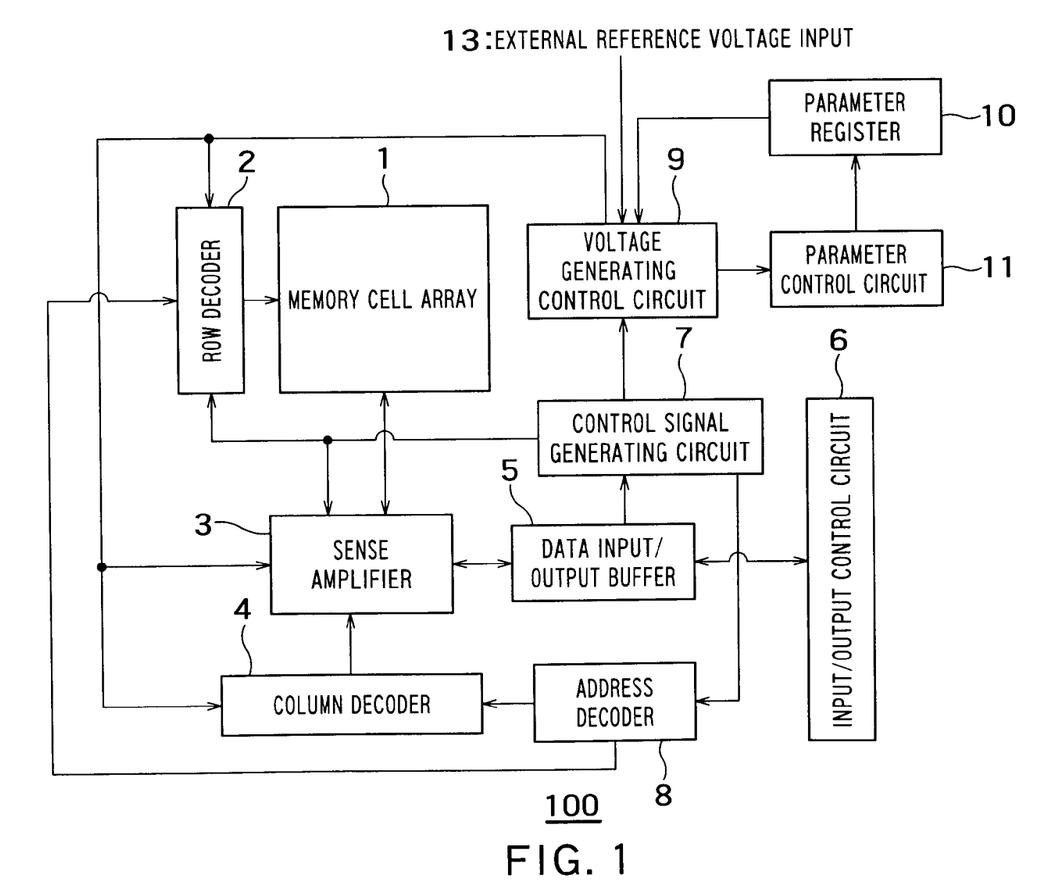
FIG. 1 is a block diagram showing the main configuration of a nonvolatile semiconductor memory 100 according to a first embodiment which is an aspect of the present invention.

FIG. 1 is a block diagram showing the main configuration of a nonvolatile semiconductor memory 100 according to the first embodiment which is an aspect of the present invention.

As shown in FIG. 1, the nonvolatile semiconductor memory 100 includes a memory cell array 1, a row decoder 2, a sense amplifier 3, a column decoder 4, a data input/output buffer 5, a first input/output control circuit 6, a control signal generating circuit 7, an address decoder 8, a voltage generating control circuit 9, a parameter register 10, a parameter control circuit 11, and a synchronous clock generating circuit 12.

The row decoder 2 is connected to word lines and includes a word line driving circuit (not shown). The row decoder 2 selects word lines of the memory cell array 1 and drives the word lines.

The sense amplifier 3 is connected to the bit lines of the memory cell array 1. The sense amplifier 3 reads data stored in memory cells and holds the read data and data written in the memory cells.

The column decoder 4 selects bit lines of the memory cell array 1.

During reading of data, data read by the sense amplifier 3 is outputted to the first input/output control circuit 6 through the data input/output buffer 5.

The first input/output control circuit 6 supplies a command to the control signal generating circuit 7 through the data input/output buffer 5. The control signal generating circuit 7 decodes the command.

Furthermore, the control signal generating circuit 7 is fed with external control signals such as a chip enable signal CE, a writing enable signal WE, a reading enable signal RE, an address latch enable signal ALE, and a command latch enable signal CLE.

Moreover, the control signal generating circuit 7 performs sequence control on writing and erasing of data and controls reading of data based on the external control signals and the command which are supplied according to an operation mode.

The control signal generating circuit 7 outputs signals for controlling operations such as reading, writing, and deletion. In response to these signals, the voltage generating control circuit 9 generates control voltages for these operations.

The address of a memory cell is supplied from the input/output control circuit 6 through the data input/output buffer 5. This address is transferred to the row decoder 2 and the column decoder 4 through the address decoder 8.

The parameter register 10 stores a plurality of parameters corresponding to the multiple control voltages. These parameters are used for correcting variations in control voltage among chips as will be described later.

The voltage generating control circuit 9 generates the control voltages according to the parameters inputted from the parameter register 10. Furthermore, the voltage generating control circuit 9 compares the control voltages and an external reference voltage and outputs trimming flag signals according to the comparison results.

The parameter control circuit 11 conducts a trimming test for determining the parameters before the shipment of the nonvolatile semiconductor memory 100. In this trimming test, control voltages corresponding to the parameters stored in the parameter register 10 are set in the voltage generating control circuit 9 and it is tested whether or not the control voltages generated in the voltage generating control circuit 9 are close to the external reference voltage. The parameter control circuit 11 controls the parameter register 10 in response to the trimming flag signals and causes the parameter register 10 to output selected parameters to the voltage generating control circuit 9.

Figure 2:
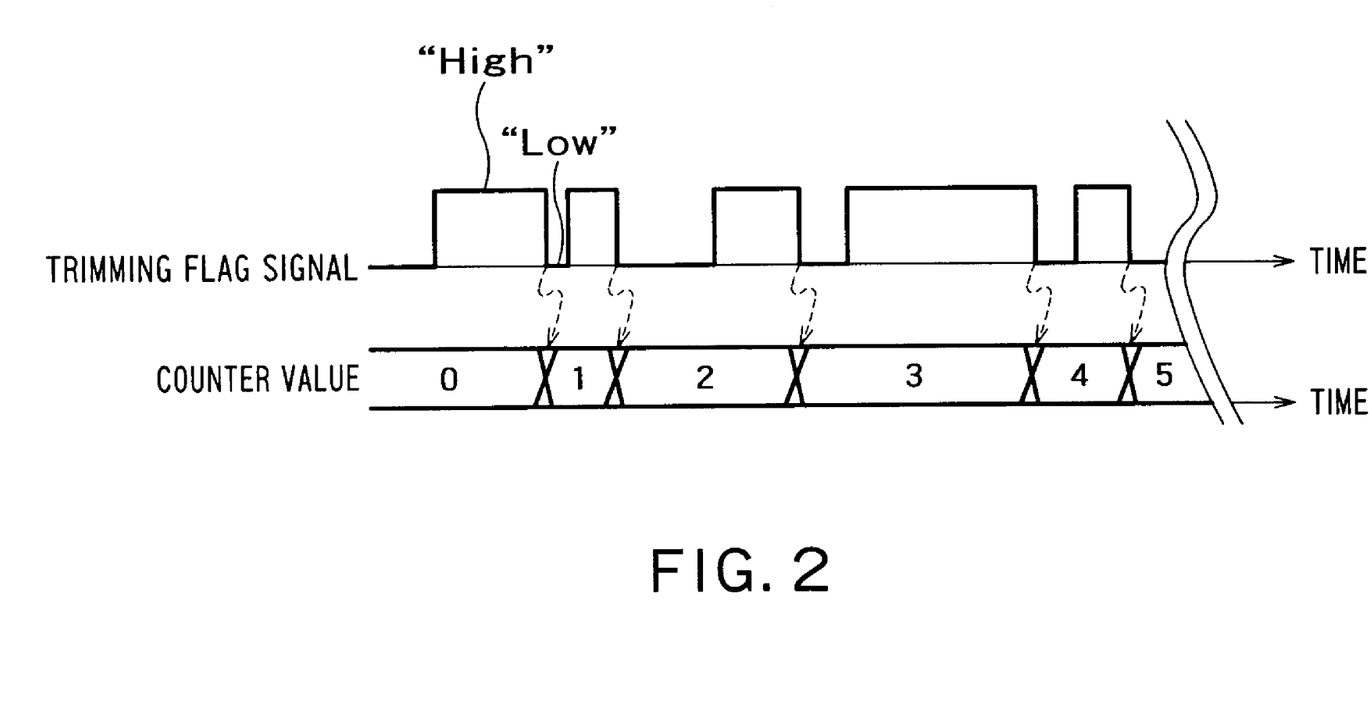
FIG. 2 illustrates the timing waveform of the trimming flag signal outputted from the voltage generating control circuit and the timing waveform of a counter value counted by the parameter control circuit in the nonvolatile semiconductor memory according to the first embodiment.

FIG. 2 illustrates the timing waveform of the trimming flag signal outputted from the voltage generating control circuit and the timing waveform of a counter value counted by the parameter control circuit in the nonvolatile semiconductor memory according to the first embodiment.

As shown in FIG. 2, the parameter control circuit 11 counts, for a fixed time period, the number of oscillations (changes from "High" to "Low") of each of the trimming flag signals having been sequentially outputted from the voltage generating control circuit 9 according to the parameters. After that, the parameter control circuit 11 stores counted values corresponding to the parameters.

Figure 3:
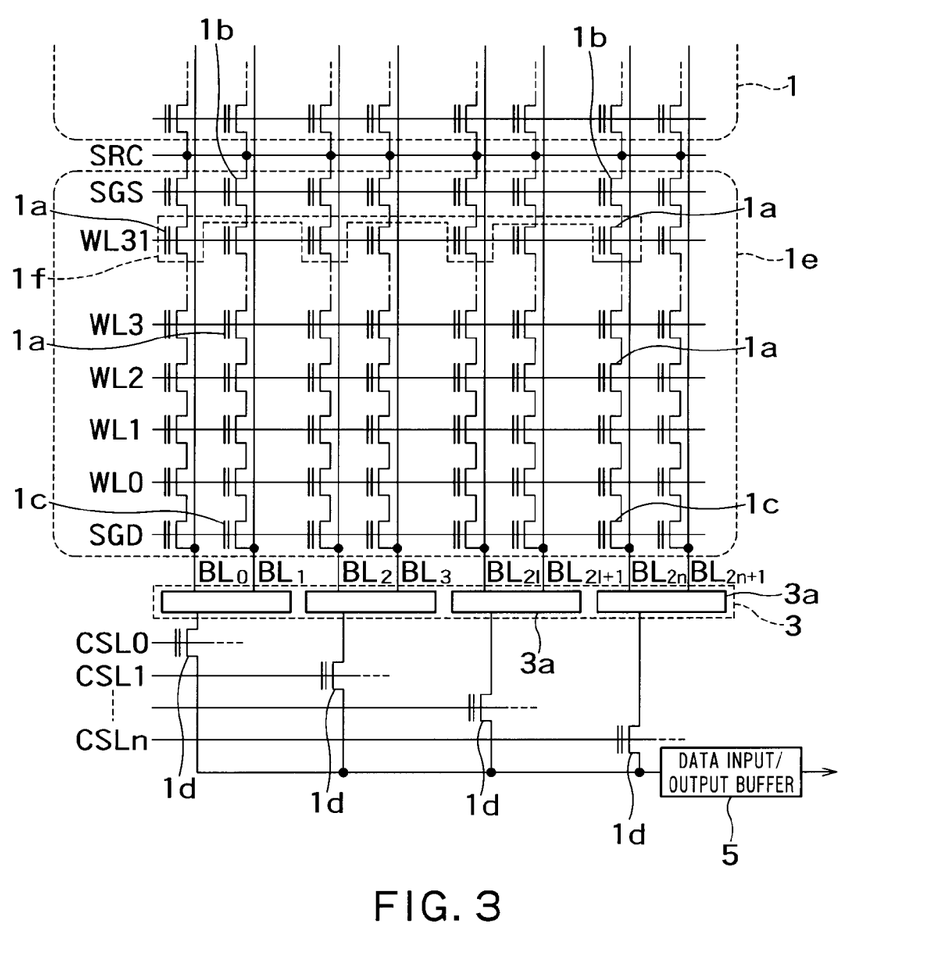
FIG. 3 is a circuit diagram including the main configuration of the memory cell array 1 shown in FIG. 1.

FIG. 3 is a circuit diagram including the main configuration of the memory cell array 1 shown in FIG. 1.

As shown in FIG. 3, the memory cell array 1 is connected to word lines WL1 to WL31 arranged along selected rows and bit lines BL0 to BL$2n$ +1 (n is an integer not smaller than 0) arranged along selected columns, and has a plurality of memory cells (NAND cells) 1*a* arranged in a matrix.

In the memory cell 1*a*, information of different x bits (x is an integer not smaller than 2) is stored according to $2^x$ threshold voltages. The information of x bits can be read from the memory cell 1*a* by applying a reading voltage to the word lines WL1 to WL31. In other words, the memory cell 1*a* stores multiple values.

The memory cell array 1 has selecting gate transistors 1*b* connecting a source line SRC and the memory cells 1*a*. The selecting gate transistors 1*b* are controlled by connecting the gates of the transistors 1*b* to a source-side selecting gate line SGS and applying a voltage from the row decoder 2 to the source-side selecting gate line SGS.

Furthermore, the memory cell array 1 has selecting gate transistors 1*c* connecting the bit lines BL0 to BL$2n$ +1 and the memory cells 1*a*. The selecting gate transistors 1*c* are controlled by connecting the gates of the transistors 1*c* to a drain-side selecting gate line SGD and applying a voltage from the row decoder 2 to the drain-side selecting gate line SGD.

The memory cells 1*a* are connected in series between the source-side selecting gate line SGS and the drain-side selecting gate line SGD.

A voltage is applied to the memory cells 1*a* and the gates of the selecting gate transistors 1*b* and 1*c* of the memory cell array 1 from the word lines WL0 to WL31 connected to the row decoder 2, so that a writing operation and a reading operation are controlled. In this way, the row decoder 2 supplies a voltage to the word lines WL0 to WL31 to operate the memory cells.

The sense amplifier 3 has n sense amplifier circuits 3*a*. The sense amplifier circuits 3*a* are connected to the data input/output buffer 5 via column selecting gates 1*d*. The column selecting gates 1*d* are controlled by column selecting signals CSL0 to CSLn. The sense amplifier circuits 3*a* are each connected to a pair of bit lines (e.g., the bit lines BL0 and BL1).

The sense amplifier circuits 3*a* control the memory cell array 1 in a column direction. To be specific, the sense amplifier circuits 3*a* charge the bit lines BL0 to BL$2n$+1 to control a writing operation and a reading operation.

The plurality of memory cells 1*a* arranged between the source-side selecting gate line SGS and the drain-side selecting gate line SGD make up a block 1*e*. Data is erased in blocks.

The memory cells 1*a* connected to the same word line (e.g., the word line WL31) and simultaneously written or read make up a sector 1*f*. The sector 1*f* stores data of x pages (for example, three pages for three bits).

The following is bit allocation for the threshold voltages of the memory cells in the nonvolatile semiconductor memory 100 which is configured thus and performs the above basic operation.

As described above, in the nonvolatile semiconductor memory 100, information of multiple bits can be stored in the memory cell 1*a* because of differences in threshold voltage.

In this case, during a reading operation, a reading voltage is applied to the single word line in each of the sectors 1f in a similar manner. And then, signals are inputted in a similar manner from the bit lines by all the n sense amplifier circuits 3a. After that, these signals are processed by the sense amplifier circuits 3a and a set of data corresponding to one page is collectively read in the column direction.

The following is the operation of a trimming test conducted by the nonvolatile semiconductor memory 100 configured thus.

Figure 4:
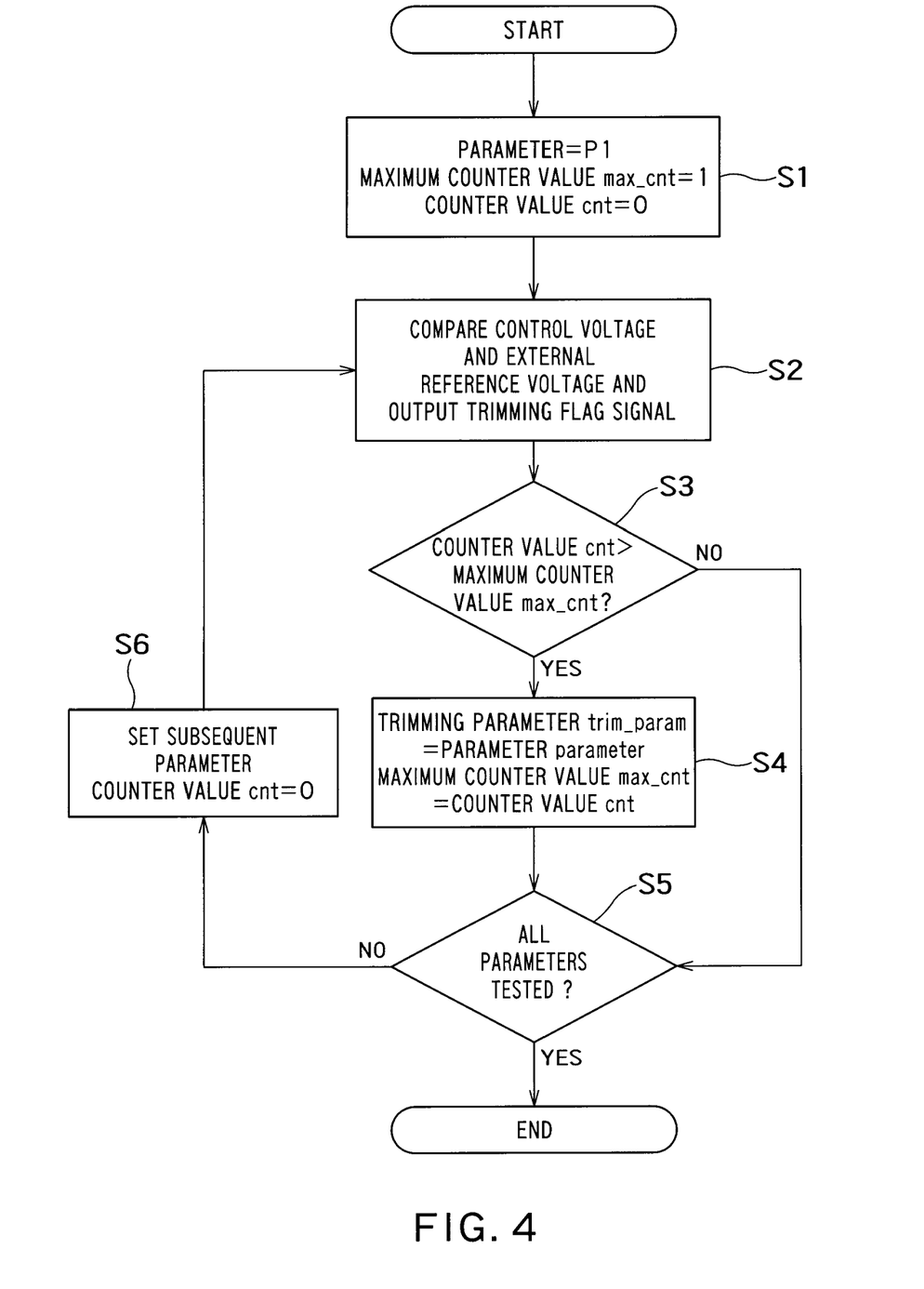
FIG. 4 is a flowchart showing the operation of a trimming test conducted by the nonvolatile semiconductor memory according to the first embodiment.
Figure 5:
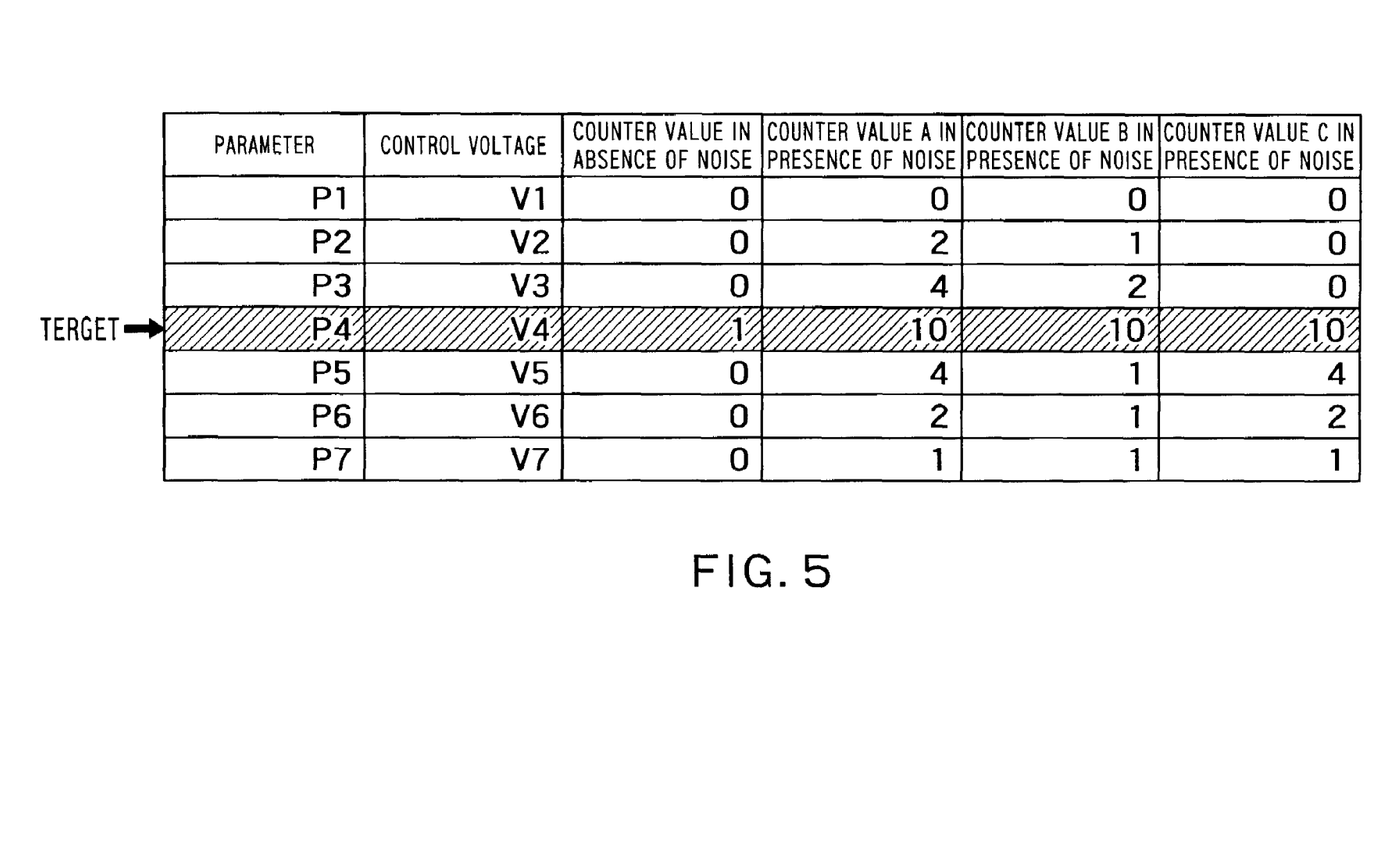
FIG. 5 shows the relationship among the parameters, the control voltages, and the counted values obtained by the operation of a trimming test shown in FIG. 4.

FIG. 4 is a flowchart showing the operation of a trimming test conducted by the nonvolatile semiconductor memory according to the first embodiment. FIG. 5 shows the relationship among the parameters, the control voltages, and the counted values obtained by the operation of a trimming test shown in FIG. 4.

Comparing the control voltages and the external reference voltage in an analog fashion as in the prior art, in the case where the control voltage and the external reference voltage are balanced, the flag signal indicating a comparison result may oscillate due to noise and a proper value may not be trimmed due to erroneous latching of the comparison result.

Thus in the present embodiment, it is assumed that a control voltage corresponding to the largest oscillation of the comparison result is the closest to the external reference voltage. The number of oscillations caused by noise is counted and a parameter corresponding to the control voltage having the largest number of oscillations (the maximum value of the count of oscillations) is set in the voltage generating control circuit as a trimming parameter "trim_param" indicating completion of trimming. Therefore, voltage trimming is more properly performed than the prior art.

The present embodiment will describe the case where the voltage generating control circuit 9 outputs the trimming flag signal at "High" level when the control voltage is larger than the external reference voltage. The trimming flag signal may be set at "Low" when the control voltage is larger than the external reference voltage.

The parameter register 10 stores parameters "P1" to "P7" corresponding to control voltages V1 to V7 as shown in FIG. 5. The control voltages V1, V2, . . . , V7 are set in order of increasing value.

A trimming test is started by inputting the external reference voltage to the voltage generating control circuit 9 from an external reference voltage input 13.

First, as shown in FIG. 4, the parameter control circuit 11 causes the parameter register 10 to output the parameter "P1" (the parameter to be first subjected to a trimming test) corresponding to the lowest control voltage V1 to the voltage generating control circuit 9. Furthermore, the parameter control circuit 11 sets the maximum counter value "max_cnt" at 1 and a current counter value "cnt" at 0 as an initial state (step S1).

Subsequently, the voltage generating control circuit 9 compares the external reference voltage and the control voltage V1 and outputs the trimming flag signal (step S2). In other words, the voltage generating control circuit 9 outputs the trimming flag signal at "High" level when the control voltage is larger than the external reference voltage, and the voltage generating control circuit 9 outputs the trimming flag signal at "Low" level when the control voltage is smaller than the external reference voltage.

After that, the parameter control circuit 11 counts, for a fixed period of time, the number of oscillations of the trimming flag signal outputted from the voltage generating control circuit 9 in response to the parameter "P1", and then the parameter control circuit 11 obtains and stores the counter value "cnt". Furthermore, the parameter control circuit 11 compares the counter value="cnt" and the current maximum counter value "max_cnt"=1 (step S3).

When the counter value "cnt" is larger than the current maximum counter value "max_cnt", the current parameter (in this case, "P1") is set at the trimming parameter "trim_param" (step S4).

After step S4, the parameter control circuit 11 decides whether or not trimming tests have been conducted on all the parameters stored in the parameter register 10 (step S5).

When the counter value "cnt" is not larger than the current maximum counter value "max_cnt" in step S3, the process advances to step S5.

In this case, since the parameter register 10 stores the untested parameters ("P2" to "P7") other than the parameter "P1", the process advances to step S6. Subsequently, the parameter control circuit 11 causes the parameter register 10 to output the parameter P2 corresponding to the second lowest control voltage V2 to the voltage generating control circuit 9. Moreover, the parameter control circuit 11 sets the current counter value "cnt" at 0. After that, the process returns to step S2, and the voltage generating control circuit 9 compares the external reference voltage and the control voltage V2 and outputs the trimming flag signal. The subsequent steps are similarly performed on the parameters "P2" to "P7".

In step S5, when the parameter control circuit 11 decides that trimming tests have been conducted on all the parameters "P1" to "P7" stored in the parameter register 10, the flow is completed. The parameter corresponding to the finally obtained maximum counter value "max_cnt" is obtained as the trimming parameter "trim_param".

In this way, the parameter control circuit 11 causes the parameter register 10 to sequentially output the plurality of parameters to the voltage generating control circuit 9 (steps S2, S3, S4, S5 and S6), and the parameter control circuit 11 counts, for a fixed period of time, the number of oscillations of the trimming flag signals sequentially outputted from the voltage generating control circuit 9 in response to the parameters (steps S2 and S3). Subsequently, the counted values are stored according to the parameters and the parameter having the maximum counted value is selected as the trimming parameter "trim_param" corresponding to the control voltage closest to the external reference voltage (steps S3, S4 and S5).

As shown in FIG. 5, in the absence of oscillation caused by noise and the like, the maximum counter value of the parameters P4 to P7 is 1. It is understood that the control voltage V4 first exceeds the external reference voltage in response to the parameter P4. Therefore, the control voltage V4 corresponding to the parameter P4 is obtained as the control voltage closest to the external reference voltage.

In the presence of oscillation caused by noise and the like, counter values A to C are 10, that is, the maximum counter value is obtained in response to the parameter P4. Therefore, as in the absence of oscillation caused by noise and the like, the control voltage V4 corresponding to the parameter P4 is obtained as the control voltage closest to the external reference voltage.

Thus it is understood that the operation of a trimming test conducted by the nonvolatile semiconductor memory 100 according to the present embodiment can enable more proper voltage trimming and obtain a desired control voltage regardless of the presence or absence of oscillation caused by noise and the like.

As described above, in the nonvolatile semiconductor memory 100, the control voltages to be supplied to the internal circuits such as the row decoder 2, the sense amplifier 3, and the column decoder 4 are set at the external reference voltage inputted from the outside, by means of the voltage generating control circuit 9, the parameter register 10, and the parameter control circuit 11.

The present embodiment described the case where the parameter control circuit 11 causes the parameter register 10 to output the plurality of parameters to the voltage generating control circuit 9 in increasing order of control voltage, from the parameter corresponding to the lowest control voltage to the parameter corresponding to the highest control voltage. The parameter control circuit 11 may cause the parameter register 10 to output the plurality of parameters to the voltage generating control circuit 9 in order of decreasing control voltage, from the parameter corresponding to the highest control voltage to the parameter corresponding to the lowest control voltage. Moreover, given parameters may be selected and trimming tests may be conducted on all the parameters.

As described above, the nonvolatile semiconductor memory according to the present embodiment can enable more proper voltage trimming and obtain a desired control voltage.

Second Embodiment

The first embodiment described the configuration in which the parameter control circuit directly counts the trimming flag signals.

The present embodiment will describe a configuration in which the trimming flag signals are counted in synchronization with a predetermined synchronous clock signal.

Figure 6:
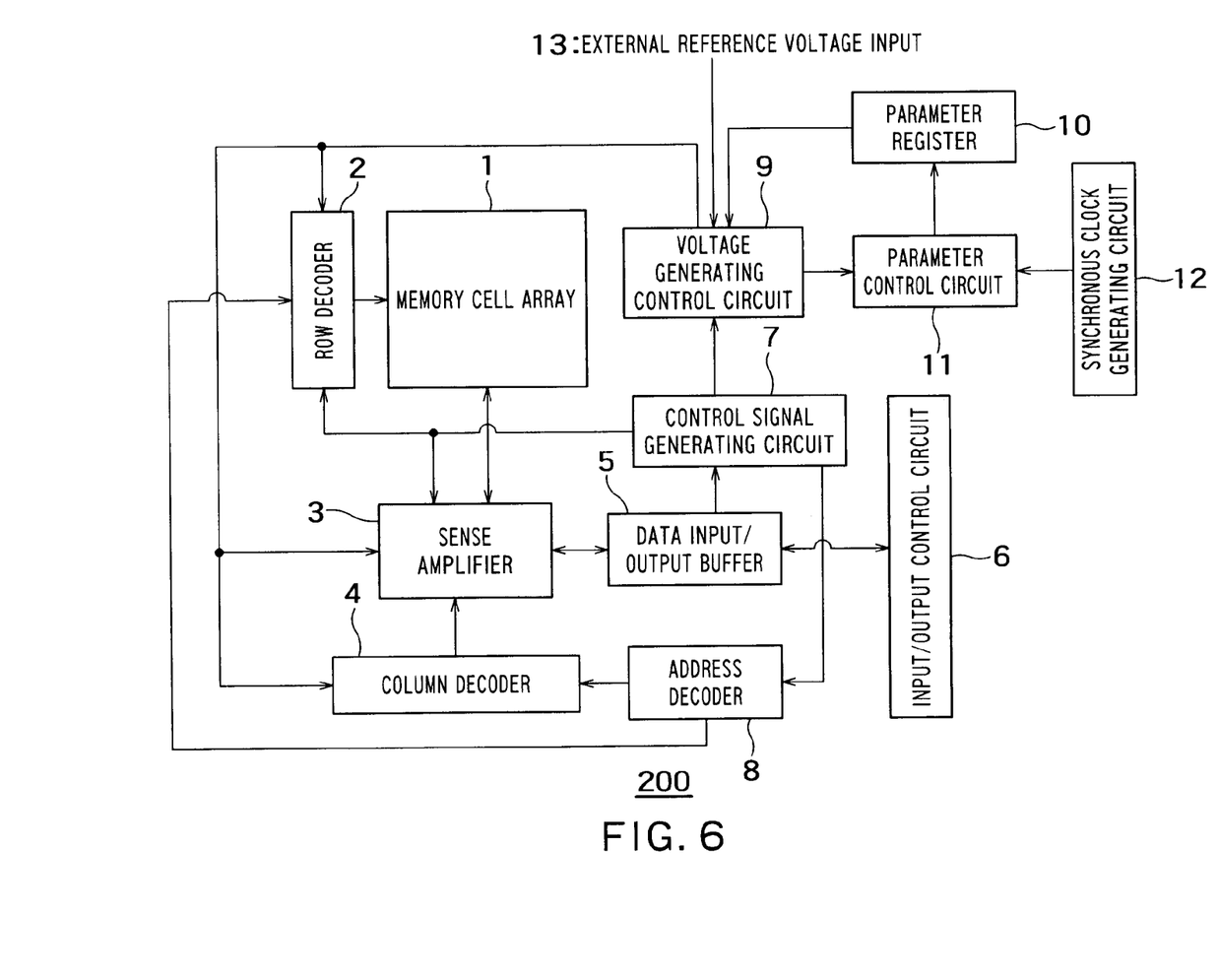
FIG. 6 is a block diagram showing the main configuration of a nonvolatile semiconductor memory 200 according to a second embodiment which is an aspect of the present invention.

FIG. 6 is a block diagram showing the main configuration of a nonvolatile semiconductor memory 200 according to the second embodiment which is an aspect of the present invention. In FIG. 6, the same reference numerals as in the first embodiment indicate the same configurations as the first embodiment.

As shown in FIG. 6, unlike the configuration of the first embodiment, the nonvolatile semiconductor memory 200 further includes a synchronous clock generating circuit 12 for outputting a synchronous clock signal to a parameter control circuit 11.

The parameter control circuit 11 counts the number of oscillations of a trimming flag signal outputted from a voltage generating control circuit 9, in synchronization with the synchronous clock signal for a fixed period of time, and the parameter control circuit 11 obtains a counted value.

The operation of a trimming test conducted by the nonvolatile semiconductor memory 200 is similar to that of the first embodiment.

Figure 7:
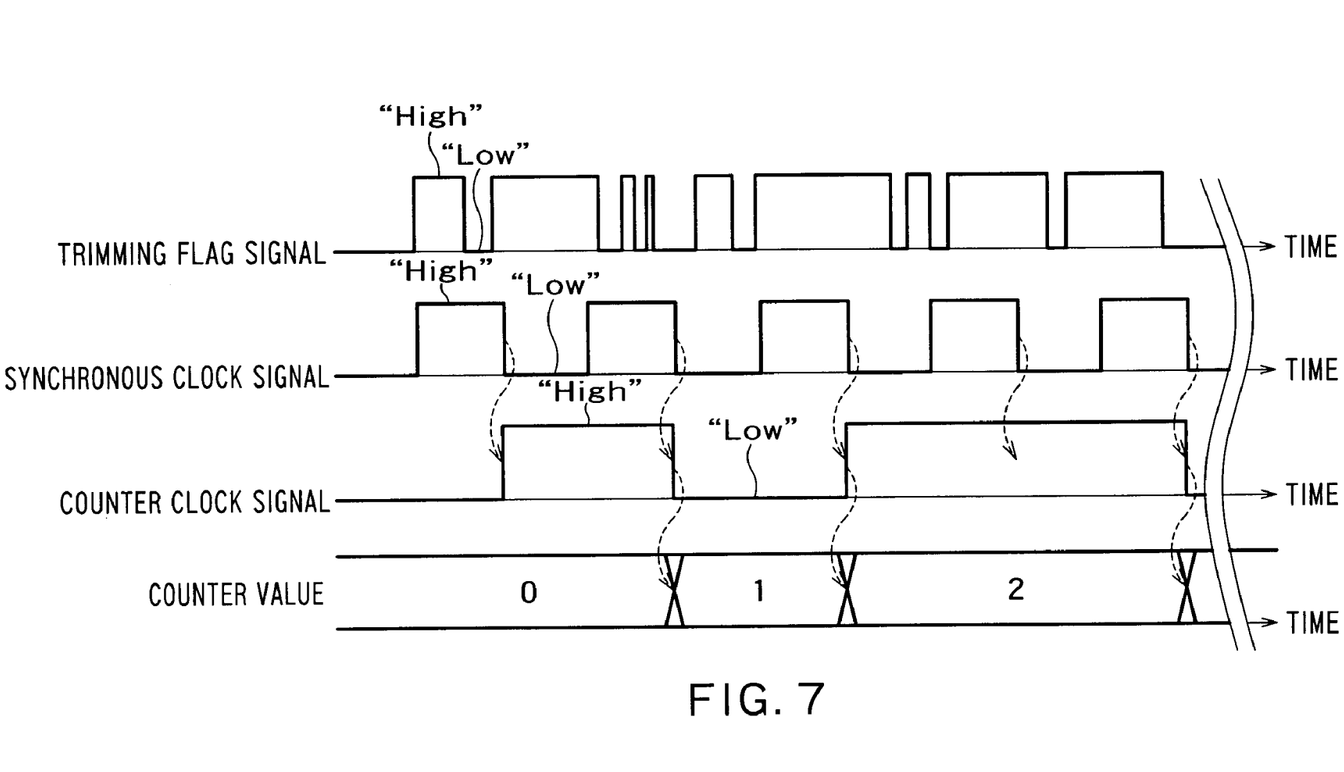
FIG. 7 illustrates the timing waveform of the trimming flag signal outputted from the voltage generating control circuit, the timing waveform of the synchronous clock signal outputted from the synchronous clock generating circuit, and the timing waveform of a counter value counted by a parameter control circuit in the nonvolatile semiconductor memory according to the second embodiment.

FIG. 7 illustrates the timing waveform of the trimming flag signal outputted from the voltage generating control circuit, the timing waveform of the synchronous clock signal outputted from the synchronous clock generating circuit, and the timing waveform of a counter value counted by a parameter control circuit in the nonvolatile semiconductor memory according to the second embodiment.

As shown in FIG. 7, while the trimming flag signal is outputted, the synchronous clock generating circuit 12 generates the synchronous clock signal having a given period.

At the falling edge of the synchronous clock signal, the parameter control circuit 11 generates a counter clock signal having the value ("High" or "Low") of the trimming flag signal. For example, the parameter control circuit 11 counts changes of the counter clock signal from "High" to "Low" or from "Low" to "High" for a fixed period of time to obtain a counter value.

Although the counter values are thinned out more than the counter values of the first embodiment. However, the same result as in FIG. 5 of the first embodiment can be obtained by the operation of a trimming by means of these counter values test conducted by the nonvolatile semiconductor memory 200 according to the second embodiment.

Furthermore, the synchronous clock signal can be executed at a given position during the period of a trimming test. The synchronous clock signal is executed to prevent an erroneous operation in a rising time at the beginning of a trimming test.

As described above, the nonvolatile semiconductor memory according to the present embodiment can enable more proper voltage trimming and obtain a desired control voltage.

What is claimed is:

1. A nonvolatile semiconductor memory for setting control voltages to be supplied to an internal circuit, to an external reference voltage inputted from outside, comprising:

a memory cell array connected to word lines along selected rows and bit lines along selected columns and having a plurality of memory cells capable of storing bit information, the memory cells being arranged in a matrix;

a row decoder connected to the word lines and supplying a voltage to the word lines to operate the memory cells;

a sense amplifier connected to the bit lines, reading data stored in the memory cells, and holding the read data and data written in the memory cells;

a parameter register for storing a plurality of parameters corresponding to the plurality of control voltages;

a voltage generating control circuit for generating the control voltages in response to the parameters inputted from the parameter register, comparing the control voltages and the external reference voltage, and outputting trimming flag signals according to comparison results; and a parameter control circuit for controlling the parameter register in response to the trimming flag signals to output the selected parameters to the voltage generating control circuit;

wherein the parameter control circuit causes the parameter register to sequentially output the plurality of parameters to the voltage generating control circuit, counts, for a fixed period of time, the number of oscillations of each of the trimming flag signals sequentially outputted from the voltage generating control circuit in response to the parameters, stores counted values corresponding to the parameters, and selects the parameter having a maximum counted value as a parameter corresponding to the control voltage closest to the external reference voltage.

2. The nonvolatile semiconductor memory according to claim 1, further comprising a synchronous clock generating circuit for outputting a synchronous clock signal to the parameter control circuit, wherein the parameter control circuit counts the oscillations of the trimming flag signal in synchronization with the synchronous clock signal for a fixed period of time, and obtains the counted value.

3. The nonvolatile semiconductor memory according to claim 1, wherein the parameter control circuit causes the parameter register to output the plurality of parameters to the voltage generating control circuit in order of increasing control voltage, from the parameter corresponding to the low control voltage to the parameter corresponding to the high control voltage.

4. The nonvolatile semiconductor memory according to claim 2, wherein the parameter control circuit causes the parameter register to output the plurality of parameters to the voltage generating control circuit in order of increasing control voltage, from the parameter corresponding to the low control voltage to the parameter corresponding to the high control voltage.

5. The nonvolatile semiconductor memory according to claim 1, wherein the parameter control circuit causes the parameter register to output the plurality of parameters to the voltage generating control circuit in order of decreasing control voltage, from the parameter corresponding to the high control voltage to the parameter corresponding to the low control voltage.

6. The nonvolatile semiconductor memory according to claim 2, wherein the parameter control circuit causes the parameter register to output the plurality of parameters to the voltage generating control circuit in order of decreasing control voltage, from the parameter corresponding to the high control voltage to the parameter corresponding to the low control voltage.

7. The nonvolatile semiconductor memory according to claim 1, wherein the nonvolatile semiconductor memory is a NAND flash memory.

8. The nonvolatile semiconductor memory according to claim 2, wherein the nonvolatile semiconductor memory is a NAND flash memory.

9. The nonvolatile semiconductor memory according to claim 3, wherein the nonvolatile semiconductor memory is a NAND flash memory.

10. The nonvolatile semiconductor memory according to claim 4, wherein the nonvolatile semiconductor memory is a NAND flash memory.

11. The nonvolatile semiconductor memory according to claim 5, wherein the nonvolatile semiconductor memory is a NAND flash memory.

12. The nonvolatile semiconductor memory according to claim 6, wherein the nonvolatile semiconductor memory is a NAND flash memory.

* * * * *